United States Patent
Saitou et al.

(10) Patent No.: US 6,909,979 B2
(45) Date of Patent: Jun. 21, 2005

(54) WAVEFORM MEASURING INSTRUMENT USING EQUIVALENT TIME SAMPLING

(75) Inventors: Takuya Saitou, Musashino (JP); Shigeru Takezawa, Musashino (JP)

(73) Assignee: Yokogawa Electric Corporation, Tokyo (JP)

(*) Notice: Subject to any disclaimer, the term of this patent is extended or adjusted under 35 U.S.C. 154(b) by 50 days.

(21) Appl. No.: 10/321,673

(22) Filed: Dec. 18, 2002

(65) Prior Publication Data

US 2003/0120443 A1 Jun. 26, 2003

(30) Foreign Application Priority Data

Dec. 21, 2001 (JP) .................................... 2001-389288

(51) Int. Cl.[7] .............................................. G01R 13/20
(52) U.S. Cl. ............................ 702/66; 702/67; 702/69; 702/80; 341/122; 345/440.1
(58) Field of Search .......................... 702/66–69, 79, 702/80; 341/122; 345/440.1

(56) References Cited

U.S. PATENT DOCUMENTS

| | | | | |
|---|---|---|---|---|
| 4,065,664 A | * | 12/1977 | Kristof et al. | ................ 702/67 |
| 4,072,851 A | * | 2/1978 | Rose | ............................ 702/68 |
| 4,093,995 A | * | 6/1978 | Smith et al. | ................... 345/24 |
| 4,104,725 A | * | 8/1978 | Rose et al. | .................... 702/68 |
| 4,134,149 A | * | 1/1979 | Nord | ....................... 345/440.1 |
| 4,791,404 A | * | 12/1988 | Hollister | ..................... 341/122 |
| 5,978,742 A | | 11/1999 | Pickerd | |

FOREIGN PATENT DOCUMENTS

JP 05257461 A * 10/1993 ............ G09G/5/36

* cited by examiner

Primary Examiner—Carol S. W. Tsai
(74) Attorney, Agent, or Firm—Westerman, Hattori, Daniels & Adrian, LLP

(57) ABSTRACT

The present invention is intended to provide a waveform measuring instrument whose waveform reproducibility in the equivalent time sampling system is improved.

The present invention is characterized by that, in a waveform measuring instrument configured so that the repeated waveform data items are acquired and sent to the acquisition memory by means of the equivalent time sampling, the above acquisition memory is divided into a plurality of time slot regions corresponding to the interval of equivalent time sampling and a plurality of memory address groups is assigned to each time slot region.

3 Claims, 7 Drawing Sheets

WAVEFORM MEASURING INSTRUMENT USING EQUIVALENT TIME SAMPLING

BACKGROUND OF THE INVENTION

1. Field of the Invention

The present invention relates to the improvement of waveform measuring instruments using equivalent time sampling, such as digital oscilloscopes.

2. Description of the Prior Art

The digital oscilloscope which is a typical waveform measuring instrument converts a time-series continuous signal waveform into digital data with an A/D converter, records the data in a memory discretely, and displays the data recorded in the memory as waveforms.

In such waveform measuring instruments, there is a repeated data acquiring mode (hereafter called "repeated mode") using equivalent time sampling as one of the methods for recording signal waveforms on the memory.

FIG. 1 is a block diagram showing a conventional embodiment in which the repeated mode function of the digital oscilloscope is considered.

Pre-amplifier 1 comprises the attenuation circuit and the pre-amplifier and adjusts the amplitude of input signals so that they come into an appropriate range for the input specifications of A/D converter (hereafter called "ADC") 2 to output them to ADC 2.

ADC 2 converts input signals to digital data items at the timing of the clock input from time base 6. The output data items of ADC 2 are transferred to primary memory 5 through primary memory controller 4 and accumulated one by one. Although the output data items of ADC 2 are accumulated in turn in primary memory 5 as waveform data items, a trigger signal is output from trigger circuit 3 to time interval measurement circuit 7 at the instant when the input waveform meets the desired trigger conditions set by an observer.

Time interval measurement circuit 7 measures the time difference between the time base and the trigger signal and sends that time difference information to primary memory controller 4.

Primary memory controller 4 sends the data read from primary memory 5 and the time difference information to acquisition memory controller 8.

Acquisition memory controller 8 transfers the data items to corresponding time slots in acquisition memory 9 based on the time difference information given from time interval measurement circuit 7.

By this series of actions, data items for a part of the waveform are acquired. Accordingly, by repeating this series of actions two or more times, data items for the entire waveform are recorded in acquisition memory 9 so that the entire waveform is re-configured.

Waveform data processor 10 implements data processing such as addition, subtraction, multiplication, etc. among a plurality of waveforms against the data items read from acquisition memory 9, and prepares the display data items corresponding to the resolution of a display. The data items processed in waveform data processor 10 are input to display processor 11.

Display processor 11 writes the display data items into display memory 12 as well as outputs the display data items in display memory 12 to display 13 such as a LCD, CRT, printer, or the like.

FIG. 2 is a drawing illustrating the relationship between the waveform data items and acquisition memory 9. In FIG. 2, "○" represents the sampling data items in time slot 1, "Δ" represents the sampling data items in time slot 2, and "×" represents the sampling data items in time slot 3. Box A in FIG. 2 expresses the configuration of acquisition memory 9 in a time series arrangement, corresponding to addresses. A set of addresses having the same symbol constitutes a time slot. In addition, Te represents the interval of equivalent time sampling data items formed by a time series arrangement of real time sampling data items in each time slot, and Tr represents the period of real time sampling data items based on actual sampling timing in each time slot.

FIG. 3 is a drawing illustrating an example of mapping of acquisition memory 9. The inside of acquisition memory 9 is divided into regions based on the concept of time slots and an address group in a predetermined region in the memory is mapped for each one of the time slots. In other words, the sampled data items for a part of a waveform obtained by one-time data acquisition are recorded in an area referenced by each address within a time slot. Since the minimum value of time intervals between time slots is equal to the resolution of time interval measurement circuit 7, the maximum number of time slots becomes dependent on the resolution of time interval measurement circuit 7.

In the meantime, there is a case where signals on the data bus, so-called "eye pattern", are observed as one of the waveform observations using the repeated mode of the digital oscilloscope. A feature of this waveform is that a plurality of voltage values exists at an instant although it is a repeated waveform.

However, in digital oscilloscopes having a conventional configuration as shown in FIG. 1, there is a problem that, if different voltage values are sampled for the same time slot, the prior measured data item is overwritten by the later measured data item and thus the prior measured data item is not recorded because only one data item can be recorded at an instant.

In addition, if zoomed waveforms of such signals are displayed, intervals between displayed data items are extended and thus the number of data item points that can be displayed on a waveform displaying screen decreases because of the limitation in resolution of the time interval measurement circuit, and this may possibly cause those waveforms not to be recognized as a time series continuous waveform group. FIG. 4 shows an example of such waveforms. In FIG. 4, symbols "○" shown with a broken line represent the points that have disappeared from the memory by overwriting though sampled voltage values exist. If such a situation occurs, reproduction and display of the original waveforms may be almost impossible.

SUMMARY OF THE INVENTION

The present invention intends to solve these problems, with the objective of improving the reproducibility of waveforms in the waveform measuring instruments that use equivalent time sampling.

In order to achieve this objective, when the repeated waveform data items sampled by equivalent time sampling are to be written to the acquisition memory, the present invention divides the above acquisition memory to a plurality of time slot regions corresponding to the interval of equivalent time sampling, assigns a plurality of memory address groups to each time slot region, and writes the waveform data items in the predetermined time slot regions of the acquisition memory based on the information on the time difference between the time base signal and trigger signal.

This enables each measured data item to be written in the acquisition memory without the later measured data being overwritten on the prior measured data, even if different voltage values are sampled in the same time slot, and thus the reproducibility of waveforms can be improved.

DESCRIPTION OF THE PREFERRED EMBODIMENTS

An embodiment of the present invention will be described below with reference to the drawings.

Figure 1:
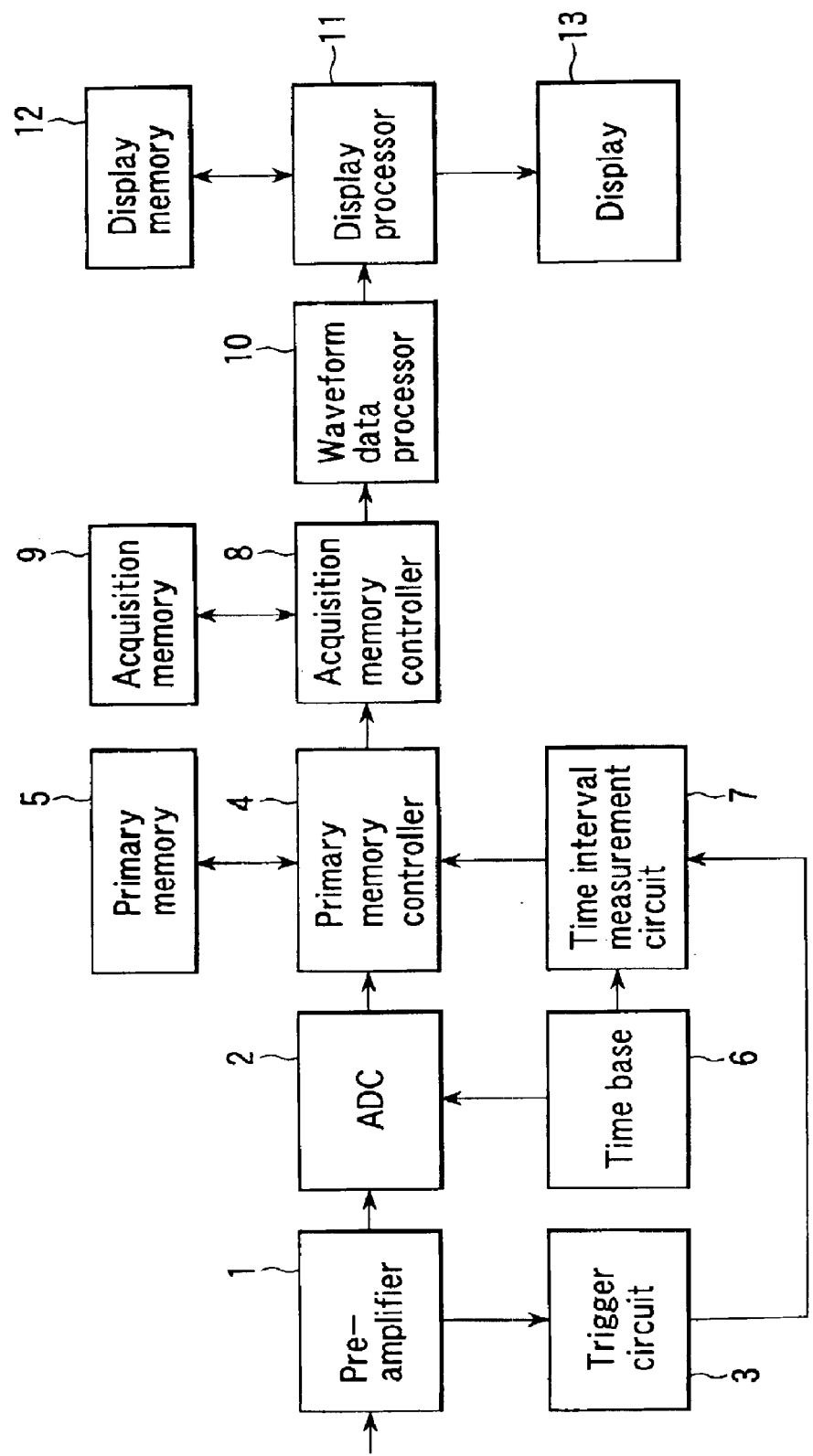
FIG. 1 is a block diagram indicating an example of conventional waveform measuring instruments.
Figure 2:
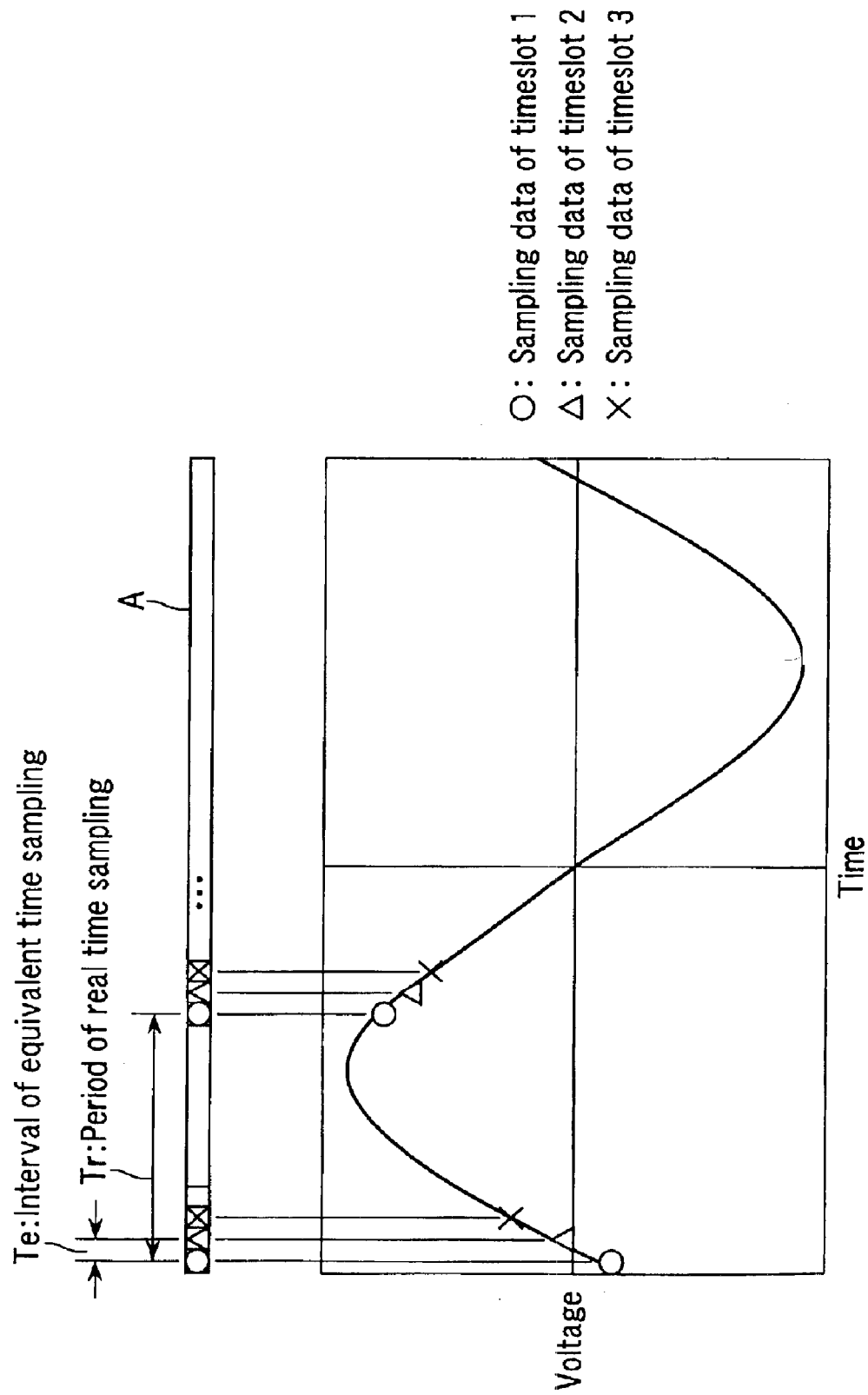
FIG. 2 is a drawing illustrating the relationship between the waveform data items and acquisition memory 9 in FIG. 1.
Figure 3:
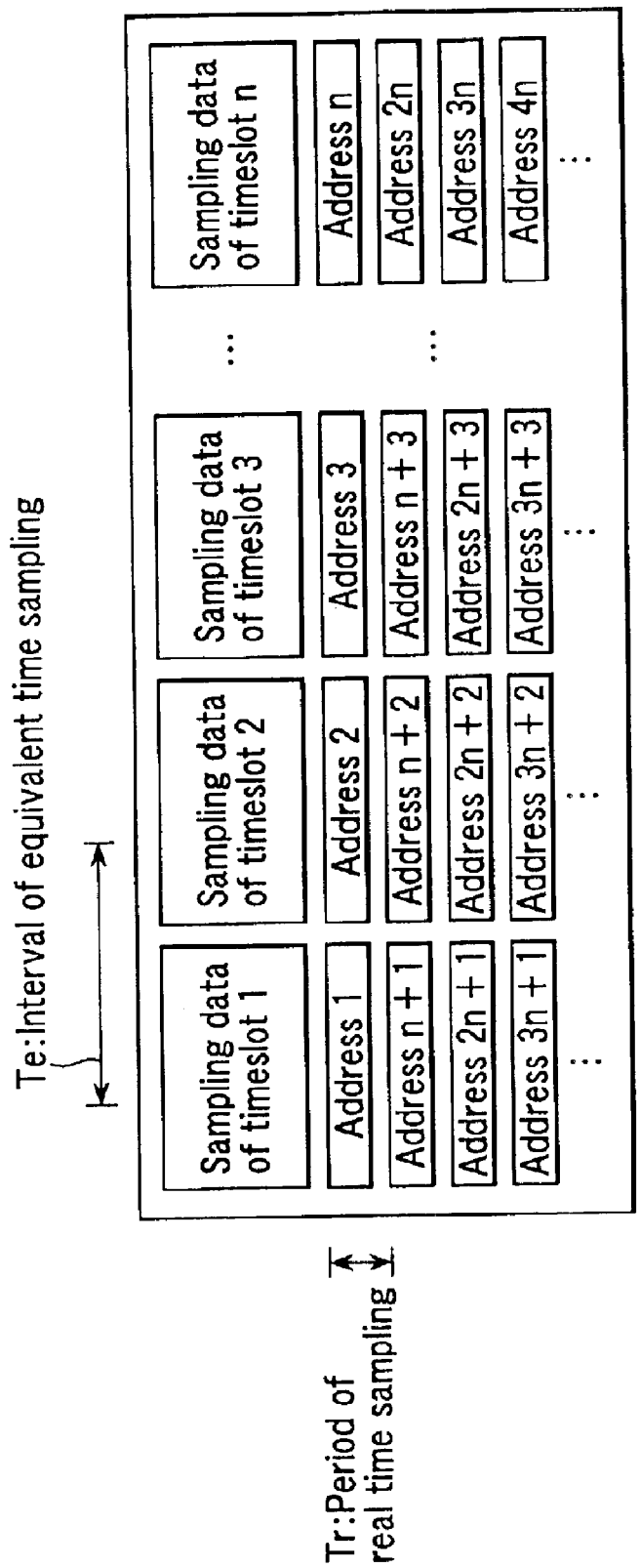
FIG. 3 is a drawing illustrating an example of mapping in acquisition memory 9 in FIG. 1.
Figure 4:
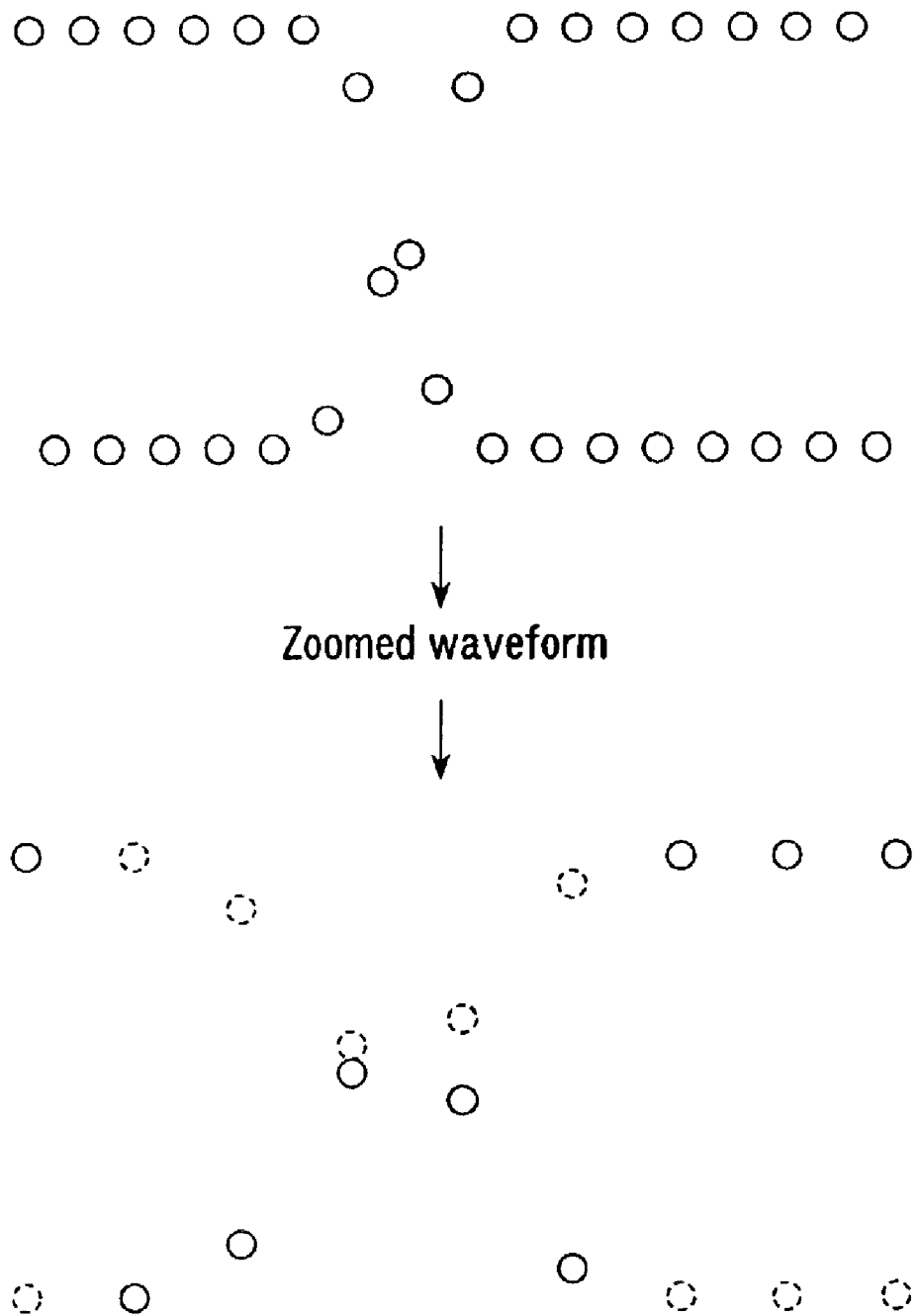
FIG. 4 is a drawing indicating an example of reproduction and display of waveforms in FIG. 1.
Figure 5:
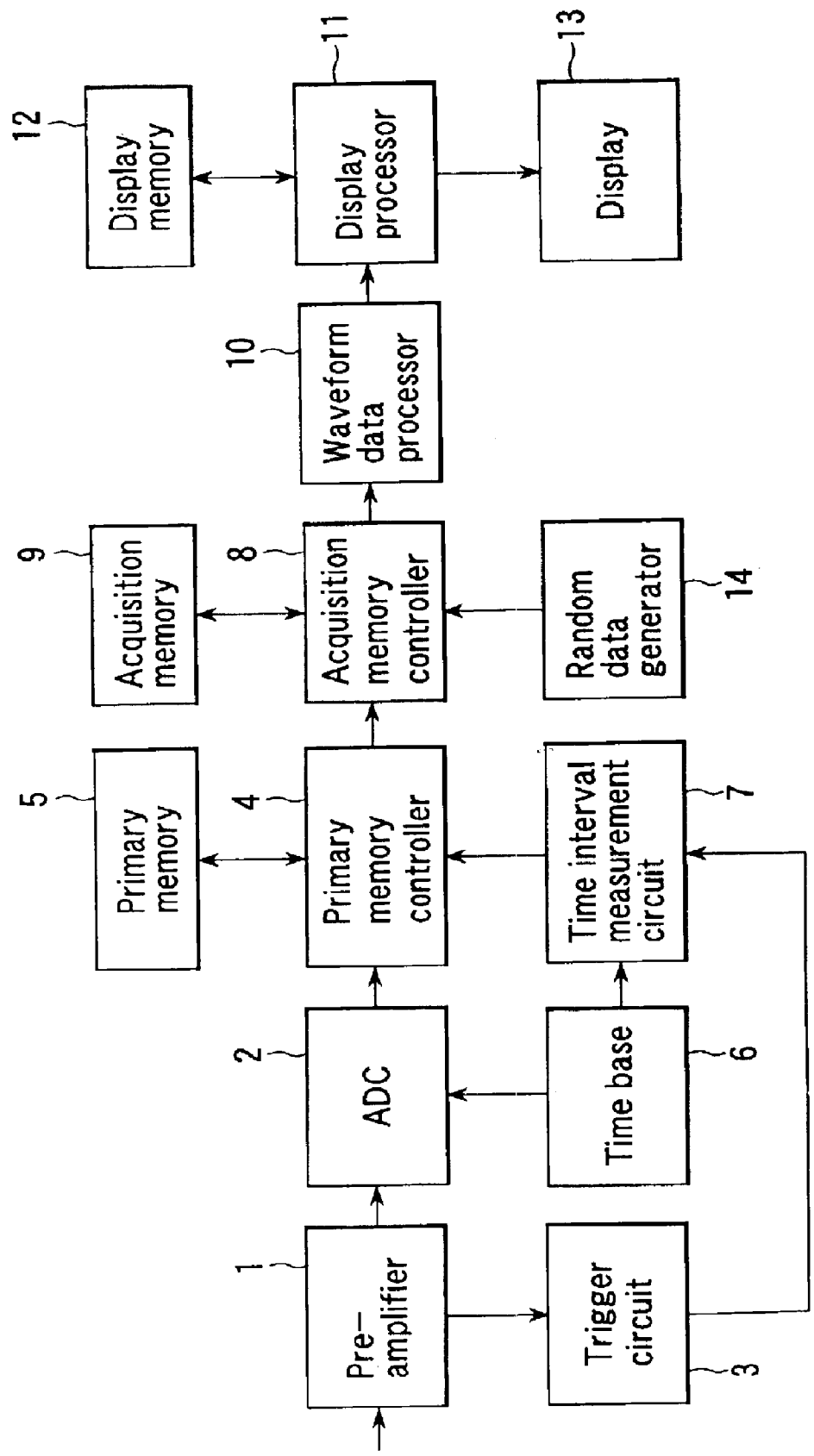
FIG. 5 is a block diagram showing an embodiment of the present invention.

FIG. 5 is a block diagram of a waveform measuring instrument showing an embodiment of the present invention, and the parts common to those in FIG. 1 are given the same signs. In FIG. 5, random data generator 14 is connected to acquisition memory controller 8. This random data generator 14 controls in what order the data items are to be recorded in predetermined regions of acquisition memory 9.

Acquisition memory 9 used in the present invention is divided into a plurality of time slot regions corresponding to the interval of equivalent time sampling and a plurality of memory address groups is assigned to each time slot region.

Figure 6:
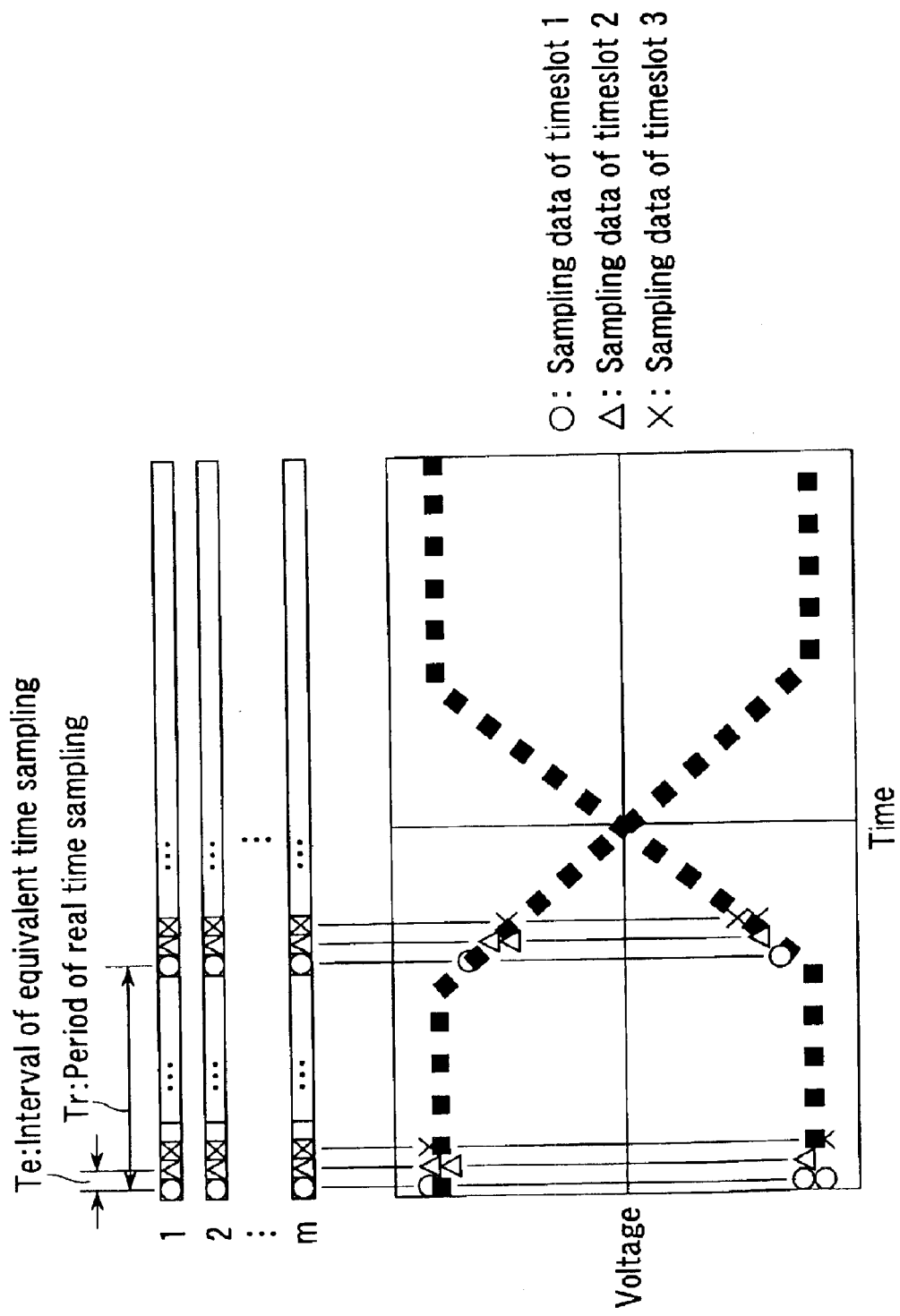
FIG. 6 is a drawing illustrating the relationship between the waveform data items and acquisition memory 9 in the present invention.

FIG. 6 is a drawing illustrating the relationship between the waveform data items and acquisition memory 9 in the present invention. In FIG. 6, symbol "○" represents the sampling data items in time slot 1, symbol "Δ" represents the sampling data items in time slot 2, and symbol "×" represents the sampling data items in time slot 3.

A plurality of boxes 1 to m in FIG. 6 corresponds to each memory address for recording a plurality of measured data items at the same instant. Each box corresponds to an address and a set of address groups having the same symbol constitutes a time slot.

Figure 7:
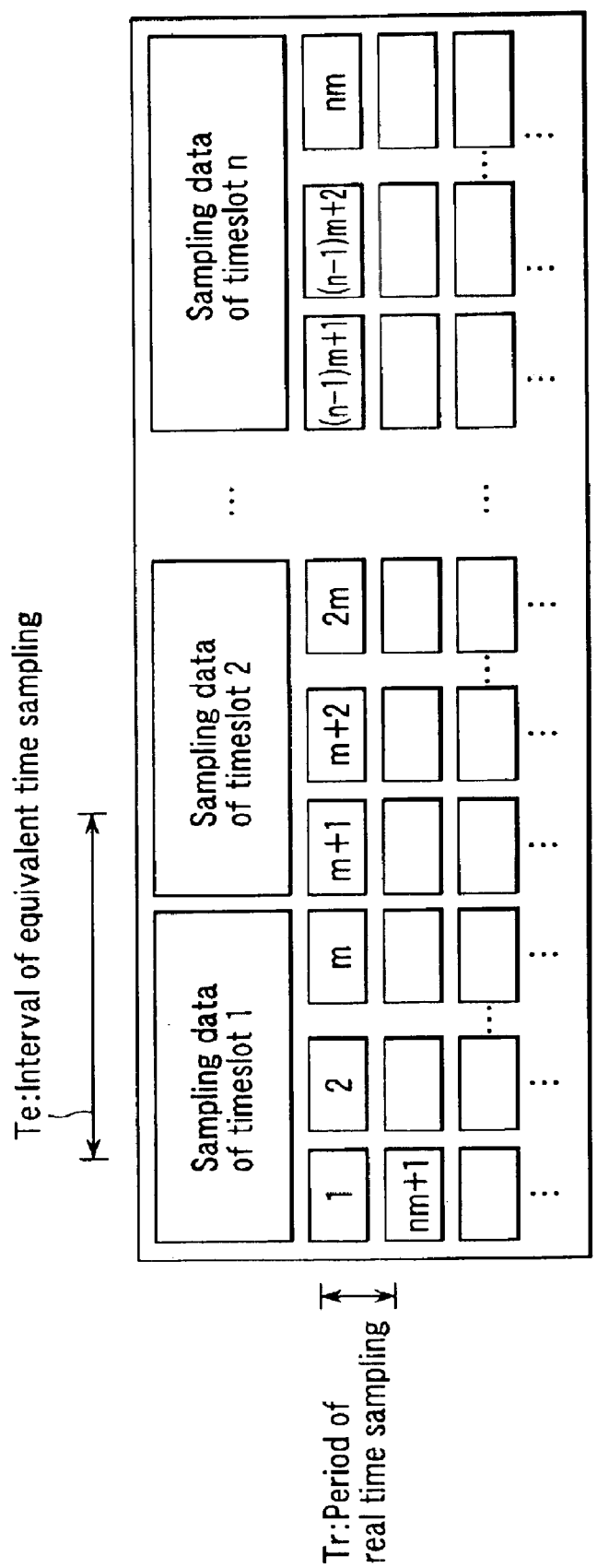
FIG. 7 is a drawing illustrating an example of mapping in acquisition memory 9 used in the present invention.

FIG. 7 is a drawing illustrating an example of mapping in acquisition memory 9 used in the present invention. To each region obtained by division with the same concept as conventional time slots, a plurality of memory address groups is assigned, different from the past.

In such a configuration, if data items to be belonging to the same time slot are acquired, acquisition memory controller 8 refers to the value of random data generator 14 (taking time slot 1 as an example, this value takes a value from 1 to m) and records the data items to the address group based on that value.

That is, it is devised such that a plurality of data items having the same time difference from the triggering point can be recorded by assigning a plurality of address groups to a time slot of acquisition memory 9, and each measured data item is written in each address in respective address groups at the instants equal to the differences from the sampling time shifted by every time value obtained by equally dividing the highest time resolution of time interval measurement circuit 7 by the number of address groups m.

Writing these measured data items in acquisition memory 9 can increase the number of data items by increasing the apparent sampling frequency and thus can enhance the reproducibility of waveforms.

Meanwhile, for deciding in what order the data items are to be recorded to each address group, the random number output of random data generator 14 is used in the embodiment shown in FIG. 5. However, if random data generator 14 outputs the same values, overwriting may occur even if there is a vacant address group in a time slot.

To overcome this problem, it is sufficient to use the following methods or the like:

1) A method to provide counters for each time slot instead of the random data generator and to carry out recording in the order according to the value of counters.

2) A method to generate pseudorandom numbers that do not generate the same value until all the address groups in a time slot are filled up and to carry out recording according to those random numbers (in this case, values that originate random numbers must be kept in each time slot).

In addition, for the method to add control information to each address group, the following method or the like may be used:

1) A method to add the information to the same region as the sampled data item.

2) A method to make the acquisition memory controller or the like manage the information by preparing a register separately.

As described above, according to the present invention, a waveform measuring instrument which can reproduce and display the repeated waveform accurately using the equivalent time sampling system can be provided and this sampling system is suitable for various types of waveform measuring instruments including digital oscilloscopes.

What is claimed is:

1. A waveform measuring instrument configured so that the repeated waveform data items are acquired by an acquisition memory using equivalent time sampling:

in which said acquisition memory is divided into a plurality of time slot regions corresponding to an interval of equivalent time sampling and a plurality of memory address groups is assigned to each time slot region, wherein said memory address groups are selected using a pseudo time data generating means in writing waveform data items in said time slot regions.

2. A waveform measuring instrument in accordance with claim 1, wherein a random data generator or a pseudorandom number generator is used as said pseudo time data generating means.

3. A waveform measuring instrument configured so that the repeated waveform data items are acquired by an acquisition memory using equivalent time sampling:

in which said acquisition memory is divided into a plurality of time slot regions corresponding to an interval of equivalent time sampling and a plurality of memory address groups is assigned to each time slot region, wherein a counter is provided in every time slot and said memory address groups are selected according to the values of these counters in writing waveform data items in said time slot regions.

* * * * *